United States Patent
Kim

(10) Patent No.: US 9,406,909 B2
(45) Date of Patent: Aug. 2, 2016

(54) ORGANIC LIGHT EMITTING TRANSISTOR AND DISPLAY DEVICE INCLUDING THE SAME

(71) Applicant: Samsung Display Co., Ltd., Yongin, Gyeonggi-Do (KR)

(72) Inventor: Ki Seo Kim, Gongju-si (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/800,547

(22) Filed: Mar. 13, 2013

(65) Prior Publication Data
US 2014/0117317 A1    May 1, 2014

(30) Foreign Application Priority Data
Oct. 30, 2012   (KR) .................. 10-2012-0121533

(51) Int. Cl.
*H01L 51/52* (2006.01)
*H01L 27/32* (2006.01)

(52) U.S. Cl.
CPC ......... *H01L 51/5296* (2013.01); *H01L 27/3274* (2013.01)

(58) Field of Classification Search
CPC ............ H01L 51/0512; H01L 51/5296; H01L 51/002; H01L 51/0023; H01L 51/102; H01L 27/3274
USPC .......................................................... 257/40
See application file for complete search history.

(56) References Cited

U.S. PATENT DOCUMENTS

| | | | |
|---|---|---|---|
| 7,939,819 B2 * | 5/2011 | Aoki | 257/40 |
| 8,008,656 B2 | 8/2011 | Nakamura et al. | |
| 8,110,825 B2 | 2/2012 | Obata et al. | |
| 8,664,644 B2 * | 3/2014 | Nathan et al. | 257/40 |
| 2004/0026689 A1 * | 2/2004 | Bernds et al. | 257/40 |
| 2005/0194640 A1 * | 9/2005 | Lazarev | 257/40 |
| 2005/0205861 A1 * | 9/2005 | Bao et al. | 257/40 |
| 2006/0060855 A1 * | 3/2006 | Lee et al. | 257/59 |
| 2006/0238690 A1 * | 10/2006 | Angelopoulos et al. | 349/143 |
| 2009/0159878 A1 * | 6/2009 | Nakamura et al. | 257/40 |
| 2009/0267075 A1 * | 10/2009 | Wang et al. | 257/72 |
| 2010/0090202 A1 | 4/2010 | Obata et al. | |
| 2010/0176381 A1 * | 7/2010 | Yagi et al. | 257/40 |
| 2010/0271353 A1 * | 10/2010 | Yoneya | 345/206 |
| 2012/0326154 A1 * | 12/2012 | Kawashima et al. | 257/59 |
| 2013/0140540 A1 * | 6/2013 | He et al. | 257/40 |

FOREIGN PATENT DOCUMENTS

| | | |
|---|---|---|
| KR | 1020080045111 | 5/2008 |
| KR | 1020080113020 | 12/2008 |
| KR | 1020100115144 | 10/2010 |

* cited by examiner

*Primary Examiner* — Bac Au
*Assistant Examiner* — Toniae Thomas
(74) *Attorney, Agent, or Firm* — Robert E. Bushnell, Esq.

(57) ABSTRACT

An organic light emitting transistor increases the amount of charge induced into an organic layer, and a display device includes the organic light emitting transistor. The organic light emitting transistor includes a substrate, an organic semiconductor layer positioned on the substrate, a source electrode and a drain electrode spaced apart from each other while contacting the organic semiconductor layer, a gate electrode insulated from the organic semiconductor layer, the source electrode and the drain electrode and positioned to overlap the organic semiconductor layer, and an auxiliary electrode overlapping the source electrode or the drain electrode.

19 Claims, 7 Drawing Sheets

110

ORGANIC LIGHT EMITTING TRANSISTOR AND DISPLAY DEVICE INCLUDING THE SAME

CLAIM OF PRIORITY

This application makes reference to, incorporates into this specification the entire contents of, and claims all benefits accruing under 35 U.S.C. §119 from an application earlier filed in the Korean Intellectual Property Office filed on Oct. 30, 2012 and there duly assigned Ser. No. 10-2012-0121533.

BACKGROUND OF THE INVENTION

1. Field of the Invention

The present invention relates to an organic light emitting transistor and a display device including the same, and more particularly, to an organic light emitting transistor which can increase the amount of charge induced into an organic layer, and a display device including the organic light emitting transistor.

2. Description of the Related Art

An organic light emitting transistor is a transistor using an organic material as a semiconductor device, unlike a general thin film transistor (TFT) using amorphous or polycrystalline silicon. The organic material used in the organic light emitting transistor as a semiconductor may be a p-type organic material including a polymer such as a conjugated polymer or thiophene, a metal phthalocyanine compound, and a condensed aromatic hydrocarbon such as pentacene, which may be used alone or in mixture with other compounds, or an n-type organic material including 1,4,5,8-naphthalene-tetracarboxylicacid-dianhydride (NTCDA), 11,11,12,12-tetracyanonaphth-2,6-quinodimethane (TCNNQD), 1,4,5,8-naphthalene-tetracarboxylic diphenylimide (NTCDI), and phthalocyanine fluoride.

The organic light emitting transistor may emit light according to the current flowing between the source electrode and the drain electrode. Thus, a display device can be formed using a plurality of organic light emitting transistors. The display device formed using the organic light emitting transistors is advantageous in achieving slimness, lightness in weight and a thin profile. In addition, the organic light emitting transistor is less restricted in selecting a substrate than the general TFT, thereby easily implementing a flexible display.

An organic layer functioning as a semiconductor in the organic light emitting transistor has low charge mobility, compared to a semiconductor layer of the general TFT. Therefore, since a small amount of current flows between the source electrode and the drain electrode of the organic light emitting transistor, the light emission efficiency of the organic light emitting transistor may not be sufficiently high.

SUMMARY OF THE INVENTION

The present invention provides an organic light emitting transistor which can control the amount of charge injected into an organic layer, and a display device including the organic light emitting transistor.

The present invention also provides an organic light emitting transistor which can control charge mobility of an organic layer, and a display device including the organic light emitting transistor.

The above and other objects of the present invention will be described in or be apparent from the following description of the preferred embodiments.

According to an aspect of the present invention, there is provided an organic light emitting transistor which includes a substrate, an organic semiconductor layer positioned on the substrate, a source electrode and a drain electrode spaced apart from each other while contacting the organic semiconductor layer, a gate electrode insulated from the organic semiconductor layer, the source electrode and the drain electrode and positioned to overlap the organic semiconductor layer, and an auxiliary electrode overlapping the source electrode or the drain electrode.

According to another aspect of the present invention, there is provided a display device including a display panel including a plurality of organic light emitting transistors, and a driver for driving the organic light emitting transistors, wherein each of the organic light emitting transistors includes a substrate, an organic semiconductor layer positioned on the substrate, a source electrode and a drain electrode spaced apart from each other while contacting the organic semiconductor layer, a gate electrode insulated from the organic semiconductor layer, the source electrode and the drain electrode and positioned to overlap the organic semiconductor layer, and an auxiliary electrode overlapping the source electrode or the drain electrode.

Embodiments of the present invention provide at least the following effects.

In the organic light emitting transistor according to embodiments of the present invention, the amount of charge injected into an organic layer of the organic light emitting transistor can be increased or decreased.

In addition, the charge mobility of the organic layer of the organic light emitting transistor can be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
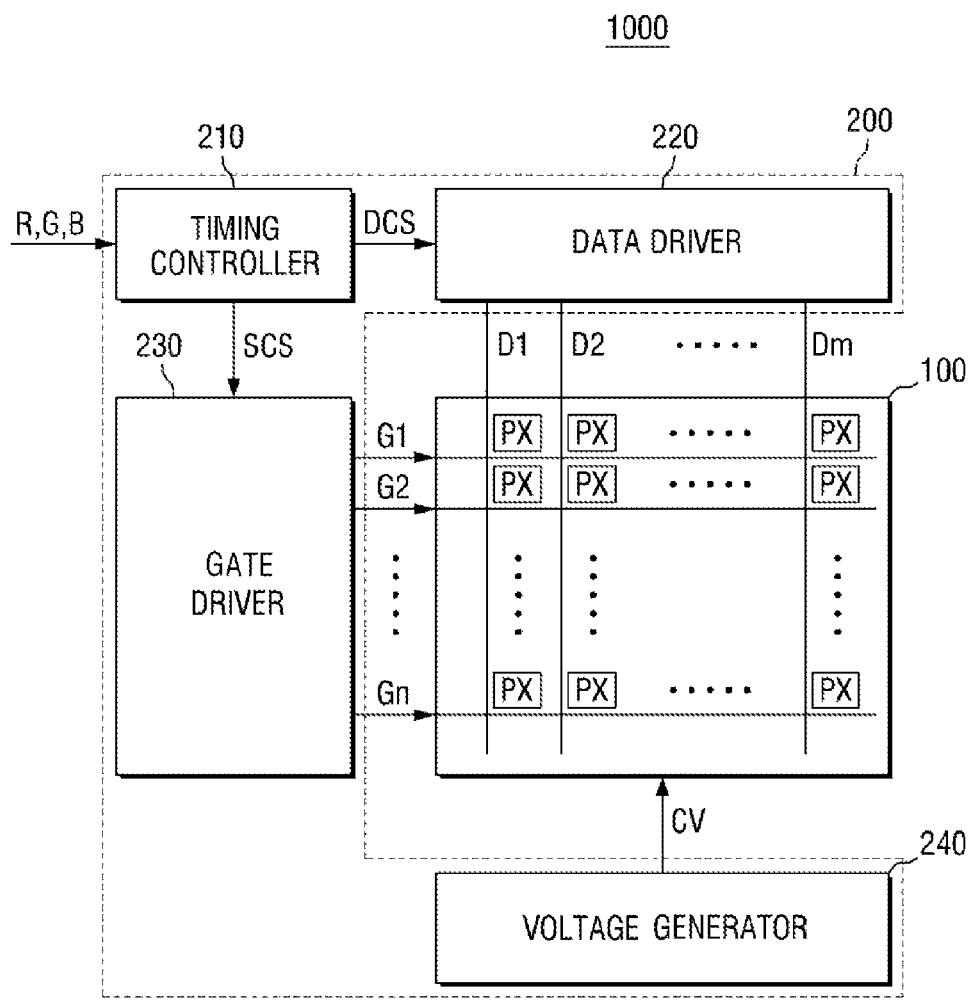
FIG. 1 is a block diagram of a display device according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that, when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Hereinafter, a display device according to an embodiment of the present invention will be described with reference to FIG. 1. FIG. 1 is a block diagram of a display device according to an embodiment of the present invention.

Referring to FIG. 1, the display device 1000 includes a display panel 100 and a driver 200.

The display panel 100 may receive gate signals G1, G2, . . . , and Gn, data signals D1, D2, . . . , and Dm and a control voltage CV and may display images corresponding thereto. The display panel 100 may include a plurality of pixels PX. The plurality of pixels PX may be arranged in a matrix configuration, but the invention is not limited thereto. The plurality of pixels PX may emit light according to the gate signals G1, G2, . . . , and Gn, the data signals D1, D2, . . . , and Dm and the control voltage CV. The data signals D1, D2, . . . , and Dm may include information on gray scales of light emitted by the plurality of pixels PX, and the gate signals G1, G2, . . . , and Gn may control the data signals D1, D2, . . . , and Dm to be transmitted to the plurality of pixels PX, respectively. The control voltage CV will later be described in more detail with reference to FIG. 2. The plurality of pixels PX may include organic light emitting transistors as light emitting devices. The organic light emitting transistor will later be described in more detail with reference to FIG. 2.

The driver 200 may receive image data (R, G, B) and may generate the gate signals G1, G2, . . . , and Gn, the data signals D1, D2, . . . , and Dm and the control voltage CV according to the image data (R, G, B) so as to supply the same to the display panel 100, thereby driving the display panel 100.

The driver 200 may include a timing controller 210, a data driver 220, a gate driver 230 and a voltage generator 240.

The timing controller 210 may receive the image data (R, G, B) and may generate a gate driver control signal SCS for controlling the gate driver 230 and a data driver control signal DCS for controlling the data driver 220 according to the image data (R, G, B). Although not shown, the timing controller 210 may further generate a signal for controlling the voltage generator 240.

The gate driver 230 may receive the gate driver control signal SCS and may generate the gate signals G1, G2, . . . , Gn according to the gate driver control signal SCS.

The data driver 220 may receive the data driver control signal DCS and may generate the data signals D1, D2, . . . , and Dm according to the data driver control signal DCS.

The voltage generator 240 may generate the control voltage CV. The control voltage CV may be a fixed value. According to some embodiments of the present invention, the control voltage CV may vary, and the value of the control voltage CV may be controlled by the timing controller 210.

Figure 2:
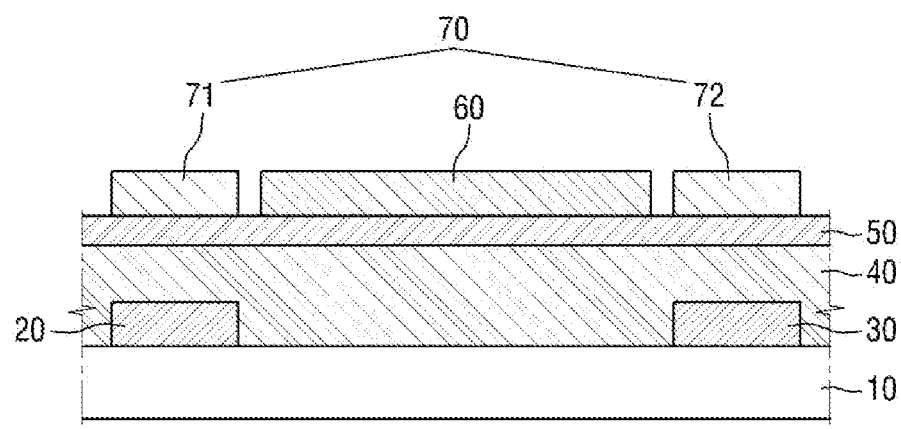
FIG. 2 is a cross-sectional view of an organic light emitting transistor according to an embodiment of the present invention.

Hereinafter, the organic light emitting transistor will be described in more detail with reference to FIG. 2. FIG. 2 is a cross-sectional view of an organic light emitting transistor according to an embodiment of the present invention.

Referring to FIG. 2, the organic light emitting transistor T1 includes a substrate 10, a source electrode 20, a drain electrode 30, an organic semiconductor layer 40, a gate electrode 60 and an auxiliary electrode 70.

The substrate 10 may support a structure of the organic light emitting transistor T1. The substrate 10 may include glass, an organic compound such as a metal oxide or nitride, a synthetic resin such as polyethylene terephthalate (PET), polyethersulfone (PES) or polycarbonate (PC), and a metal or silicon wafer. According to some embodiments, if the organic light emitting transistor T1 can be sufficiently supported by a structure other than the substrate 10, the substrate 10 may not be provided.

The organic semiconductor layer 40 may be disposed on the substrate 10. The organic semiconductor layer 40 may be made of a p-type organic semiconductor material or an n-type organic semiconductor material. When a potential difference between the gate electrode 60 and the source electrode 20 is greater than or equal to a threshold voltage, the organic semiconductor layer 40 may function as a conductor, thereby turning on the organic light emitting transistor T1. If the organic light emitting transistor T1 is turned on, the organic semiconductor layer 40 may receive holes from the source electrode 20 or electrons from the drain electrode 30 and the electrons may function as charges, thereby allowing the flow to flow in the organic semiconductor layer 40.

The source electrode 20 and the drain electrode 30, which are spaced apart from each other, are positioned on the substrate 10. The source electrode 20 and the drain electrode 30 are disposed to contact the organic semiconductor layer 40. While FIG. 2 shows that top portions of and a region between the source electrode 20 and the drain electrode 30 are covered by the organic semiconductor layer 40, the arrangement of the source electrode 20, the drain electrode 30 and the organic semiconductor layer 40 may vary according to embodiments.

The gate electrode 60 may be positioned on the organic semiconductor layer 40 so as to overlap the organic semiconductor layer 40. The gate electrode 60 may be insulated from the organic semiconductor layer 40, the source electrode 20 and the drain electrode 30. The gate electrode 60 may be positioned to overlap a region of the organic semiconductor layer 40 between the source electrode 20 and the drain electrode 30. The organic light emitting transistor T1 may be turned on or off according to the signal applied to the gate electrode 60.

The auxiliary electrode 70 may be positioned to overlap the source electrode 20 or the drain electrode 30. The auxiliary electrode 70 may be insulated from the source electrode 20, the drain electrode 30 and the organic semiconductor layer 40. The auxiliary electrode 70 may include a first auxiliary electrode 71 and a second auxiliary electrode 72. The first auxiliary electrode 71 may be positioned to overlap the source electrode 20, and the second auxiliary electrode 72 may be positioned to overlap the drain electrode 30.

The control voltage CV may be applied to the auxiliary electrode 70. The control voltage CV applied to the first auxiliary electrode 71 and the control voltage CV applied to the second auxiliary electrode 72 may be different from each other. The control voltage CV may control the amount of charge injected into the organic semiconductor layer 40. For example, when the control voltage CV having a positive polarity is applied to the first auxiliary electrode 71, the amount of holes injected from the source electrode 20 into the organic semiconductor layer 40 can be decreased. On the contrary, when the control voltage CV having a negative polarity is applied to the first auxiliary electrode 71, the amount of holes injected from the source electrode 20 into the organic semiconductor layer 40 can be increased. When the control voltage CV having a positive polarity is applied to the second auxiliary electrode 72, the amount of charge having a negative polarity injected from the drain electrode 30 into the organic semiconductor layer 40 can be increased. On the contrary, when the control voltage CV having a negative polarity is applied to the second auxiliary electrode 72, the amount of charge injected from the drain electrode 30 into the organic semiconductor layer 40 can be decreased.

When the control voltage CV having a negative polarity is applied to the first auxiliary electrode 71 and the control voltage CV having a positive polarity is applied to the second auxiliary electrode 72, the amounts of holes and electrons injected into the organic semiconductor layer 40 can be increased, thereby improving light emission efficiency of the organic light emitting transistor T1. When the control voltage CV having a positive polarity is applied to the first auxiliary electrode 71 and the control voltage CV having a negative polarity is applied to the second auxiliary electrode 72, the light emission efficiency of the organic light emitting transistor T1 may be lowered by decreasing the amounts of holes and electrons injected into the organic semiconductor layer 40.

When the control voltage CV having a positive polarity is applied to both of the first auxiliary electrode 71 and the second auxiliary electrode 72, injection of holes into the organic semiconductor layer 40 may be decreased and injection of electrons into the organic semiconductor layer 40 may be increased. If the organic semiconductor layer 40 is formed of a p-type organic semiconductor, holes can be more easily injected into the organic semiconductor layer 40 than electrons can be. Therefore, the electrons and holes injected into the organic semiconductor layer 40 are adjusted in number by applying the control voltage CV having a positive polarity to both of the first auxiliary electrode 71 and the second auxiliary electrode 72, thereby improving the charge transport efficiency.

When the control voltage CV having a negative polarity is applied to both of the first auxiliary electrode 71 and the second auxiliary electrode 72, injection of holes into the organic semiconductor layer 40 may be increased and injection of electrons into the organic semiconductor layer 40 may be decreased. If the organic semiconductor layer 40 is formed of an n-type organic semiconductor, electrons can be more easily injected into the organic semiconductor layer 40 than holes can be. Therefore, the electrons and holes injected into the organic semiconductor layer 40 are adjusted in number by applying the control voltage CV having a negative polarity to both of the first auxiliary electrode 71 and the second auxiliary electrode 72, thereby improving the charge transport efficiency.

As described above, the organic light emitting transistor T1 can efficiently control the amount of charge injected and the charge transport efficiency according to the control voltage CV applied to the auxiliary electrode 70. Therefore, the display device 1000 may control characteristics of the organic light emitting transistor T1 included in each pixel PX of the display panel 100 by controlling the control voltage CV, thereby controlling an image displayed on the display panel 100.

The organic light emitting transistor T1 may further include an insulating layer 50. The insulating layer 50 may insulate the organic semiconductor layer 40 and the gate electrode 60 from each other. The insulating layer 50 may also insulate the organic semiconductor layer 40 and the auxiliary electrode 70 from each other. The insulating layer 50 may be positioned between the organic semiconductor layer 40 and the gate electrode 60 and between the organic semiconductor layer 40 and the auxiliary electrode 70.

Figure 3:
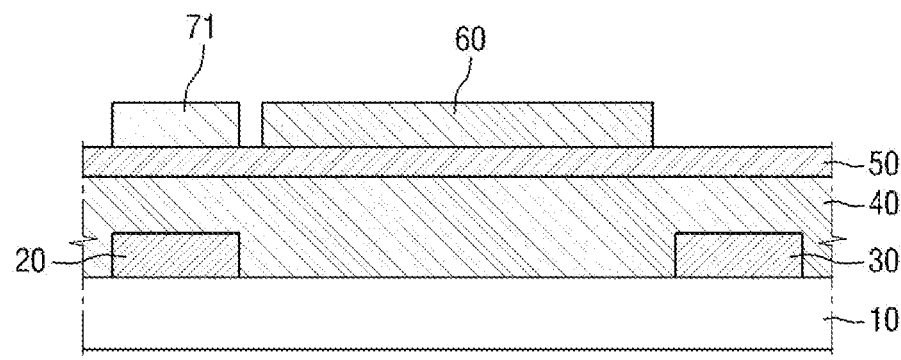
FIG. 3 is a cross-sectional view of an organic light emitting transistor according to another embodiment of the present invention.

Hereinafter, another embodiment of the present invention will be described in more detail with reference to FIG. 3. FIG. 3 is a cross-sectional view of an organic light emitting transistor according to another embodiment of the present invention.

Referring to FIG. 3, as compared with the organic light emitting transistor T1 shown in FIG. 2, an organic light emitting transistor T2 may not include a second auxiliary electrode 72. That is to say, the organic light emitting transistor T2 may include only a first auxiliary electrode 71 as an auxiliary electrode. Even if the organic light emitting transistor T2 includes only the first auxiliary electrode 71 as an auxiliary electrode, the amount of holes injected into an organic semiconductor layer 40 from a source electrode 20 can be controlled according to a control voltage CV applied to the first auxiliary electrode 71, thereby controlling the organic light emitting transistor T2 in view of the amount of charge and charge transport efficiency.

Since the other components are substantially the same as those shown in FIG. 2, repeated descriptions thereof will be omitted.

Figure 4:
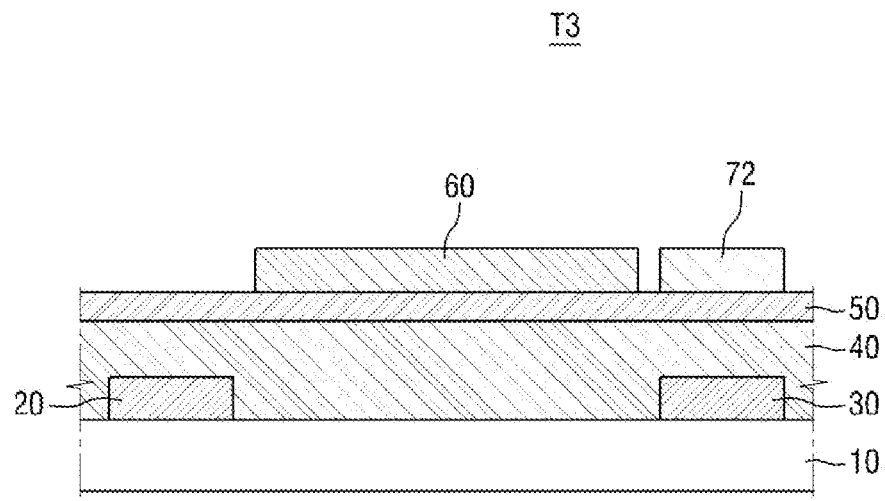
FIG. 4 is a cross-sectional view of an organic light emitting transistor according to still another embodiment of the present invention.

Hereinafter, still another embodiment of the present invention will be described in more detail with reference to FIG. 4. FIG. 4 is a cross-sectional view of an organic light emitting transistor according to still another embodiment of the present invention.

Referring to FIG. 4, as compared with the organic light emitting transistor T1 shown in FIG. 2, an organic light emitting transistor T3 may not include a first auxiliary electrode 71. That is to say, the organic light emitting transistor T3 may include only a second auxiliary electrode 72 as an auxiliary electrode. Even if the organic light emitting transistor T3 includes only the second auxiliary electrode 72 as an auxiliary electrode, the amount of electrons injected into an organic semiconductor layer 40 from a drain electrode 30 can be controlled according to a control voltage CV applied to the second auxiliary electrode 72, thereby controlling the organic light emitting transistor T3 in view of the amount of charges and charge transport efficiency.

Since the other components are substantially the same as those shown in FIG. 2, repeated descriptions thereof will be omitted.

Figure 5:
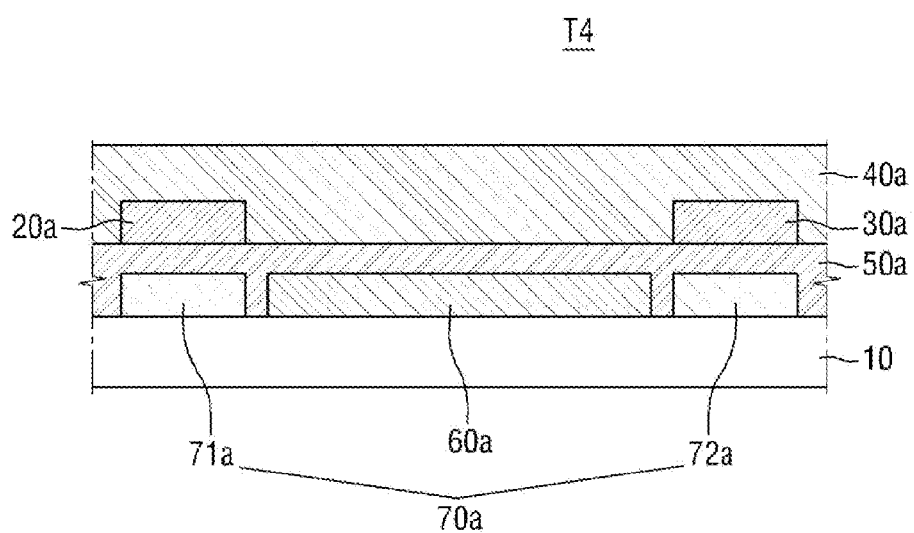
FIG. 5 is a cross-sectional view of an organic light emitting transistor according to still another embodiment of the present invention.

Hereinafter, still another embodiment of the present invention will be described in more detail with reference to FIG. 5. FIG. 5 is a cross-sectional view of an organic light emitting transistor according to still another embodiment of the present invention.

Referring to FIG. 5, an organic light emitting transistor T4 may include a substrate 10, a source electrode 20a, a drain electrode 30a, an organic semiconductor layer 40a, an insulating layer 50a, a gate electrode 60a and an auxiliary electrode 70a.

The auxiliary electrode 70a and the gate electrode 60a may be positioned on the substrate 10 and the insulating layer 50a may be positioned to cover top surfaces of the auxiliary electrode 70a and the gate electrode 60a. The organic semiconductor layer 40a, the source electrode 20a and the drain electrode 30a may be positioned on the insulating layer 50a. Since the other components are substantially the same as those shown in FIG. 2, repeated descriptions thereof will be omitted. The organic light emitting transistor T4 shown in FIG. 5 may operate in substantially the same manner as the organic light emitting transistor T1 shown in FIG. 2. The components of the organic light emitting transistor T4 may vary in various manners as well as the manners shown in FIGS. 2 and 5.

The auxiliary electrode 70a may include a first auxiliary electrode 71a and a second auxiliary electrode 72a. In some embodiments, the first auxiliary electrode 71a may not be provided, and in some other embodiments, the second auxiliary electrode 72a may not be provided.

Figure 6:
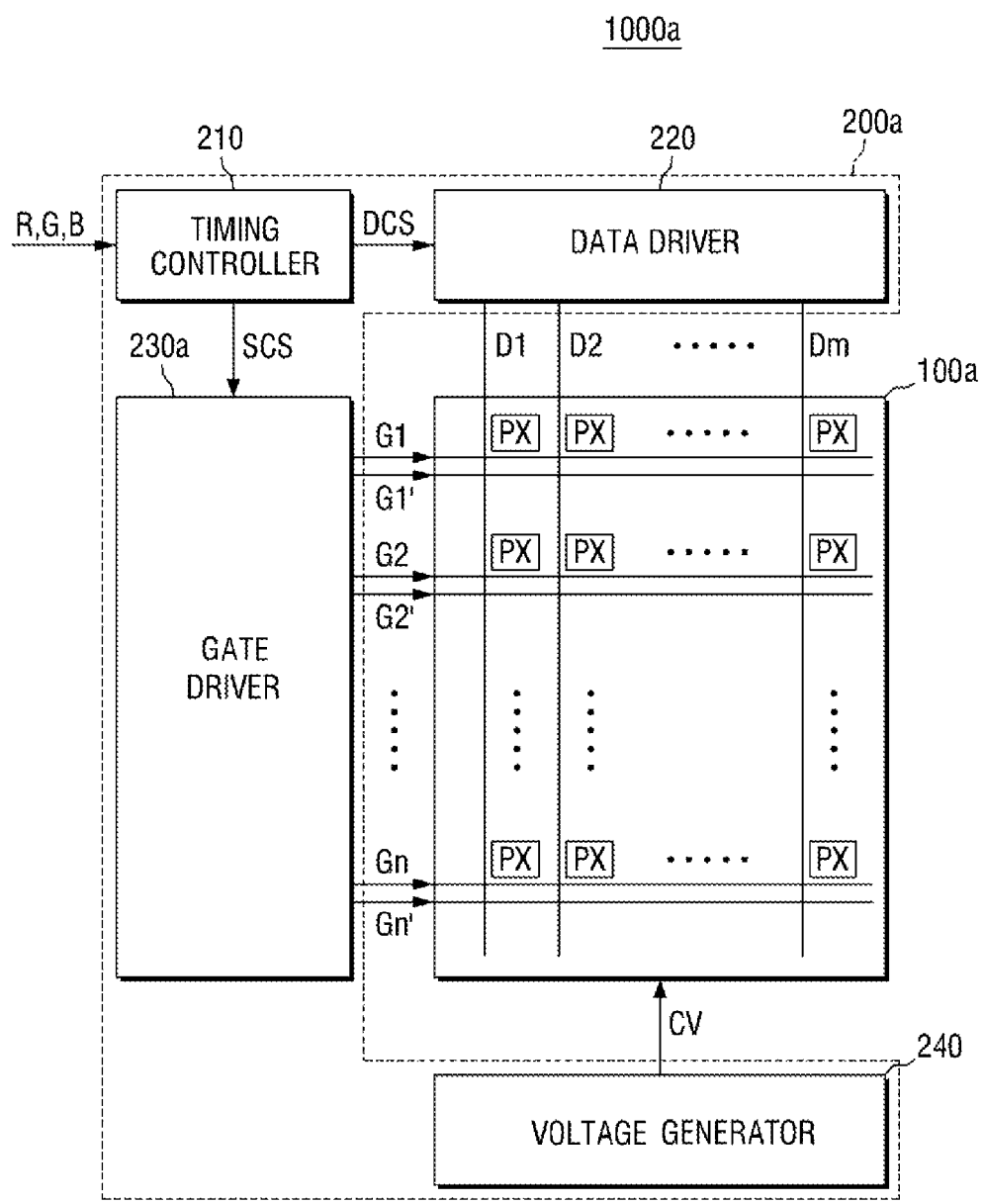
FIG. 6 is a block diagram of a display device according to another embodiment of the present invention.

Hereinafter, still another embodiment of the present invention will be described in more detail with reference to FIG. 6. FIG. 6 is a block diagram of a display device according to another embodiment of the present invention.

The display device 1000a may include a display panel 100a and a driver 200a.

In order to drive the display panel 100a, the driver 200a may generate first gate signals G1, G2, ..., and Gn and second gate signals G1', G2', ..., and Gn' to supply the same to the display panel 100a. The driver 200a may include a gate driver 230a that generates the first gate signals G1, G2, ..., and Gn and the second gate signals G1', G2', ..., and Gn'. The first gate signals G1, G2, ..., and Gn and the second gate signals G1', G2', ..., and Gn' will be described later with reference to FIG. 7.

The display panel 100a may receive the first gate signals G1, G2, ..., and Gn, the second gate signals G1', G2', ..., and Gn'), data signals D1, D2, ..., and Dm and a control voltage CV, and may display images corresponding thereto. The display panel 100a may include a plurality of pixels PX. The plurality of pixels PX may emit light according to the first gate signals G1, G2, ..., and Gn, the second gate signals G1', G2', ..., and Gn'), the data signals D1, D2, ..., and Dm and the control voltage CV. The plurality of pixels PX may include organic light emitting transistors as light emitting devices.

Since the other components of the display device 1000a are substantially the same as those shown in FIG. 1, repeated descriptions thereof will be omitted.

Figure 7:
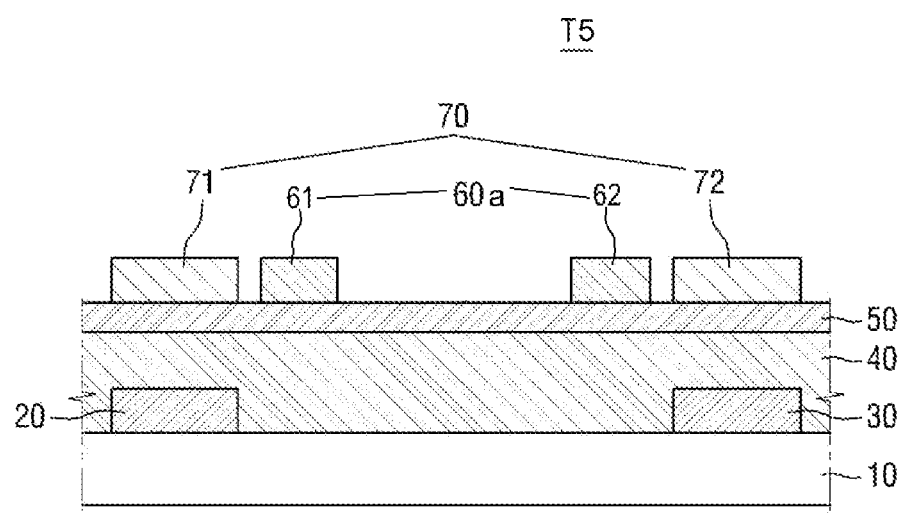
FIG. 7 is a cross-sectional view of an organic light emitting transistor according to still another embodiment of the present invention.

Hereinafter, an organic light emitting transistor included in the display panel 100a will be described in more detail with reference to FIG. 7. FIG. 7 is a cross-sectional view of an organic light emitting transistor according to still another embodiment of the present invention.

Referring to FIG. 7, the organic light emitting transistor T5 may include a substrate 10, a source electrode 20, a drain electrode 30, an organic semiconductor layer 40, an insulating layer 50, a gate electrode 60a and an auxiliary electrode 70.

The gate electrode 60a may include a first gate electrode 61 and a second gate electrode 62 spaced apart from each other. The first gate electrode 61 may be positioned adjacent to the source electrode 20, and the second gate electrode 62 may be positioned adjacent to the drain electrode 30. Different voltages may be applied to the first gate electrode 61 and the second gate electrode 62. For example, voltages corresponding to first gate signals G1, G2, ..., and Gn may be applied to the first gate electrode 61, and voltages corresponding to second gate signals G1', G2', ..., and Gn' may be applied to the second gate electrode 62. The voltages corresponding to the first gate signals G1, G2, ..., and Gn may be the same signals as the first gate signals G1, G2, ..., and Gn or voltages depending on modified first gate signals derived from the first gate signals G1, G2, ..., and Gn, and the same may also be applied to the voltages corresponding to the second gate signals G1', G2', ..., and Gn'.

When a higher voltage is applied to the second auxiliary electrode 72 than to the first auxiliary electrode 71, a voltage that is a threshold voltage lower than that applied to the source electrode 20 may be applied to the drain electrode 30. In this case, since a direction of an electric field created between the drain electrode 30 and the source electrode 20 is opposite to a direction of an electric field created between the first auxiliary electrode 71 and the second auxiliary electrode 72, the charge transport efficiency of the organic semiconductor layer 40 may be lowered. Here, when the voltage applied to the first gate electrode 61 is higher than the voltage applied to the second gate electrode 62, since a direction of an electric field created between the first gate electrode 61 and the second gate electrode 62 is opposite to a direction of an electric field created between the first auxiliary electrode 71 and the second auxiliary electrode 72, the electric fields created between the first auxiliary electrode 71 and the second auxiliary electrode 72 are offset, thereby increasing the charge transport efficiency in the organic semiconductor layer 40. If the voltage applied to the first gate electrode 61 is lower than the voltage applied to the second gate electrode 62, the electric field created between the first auxiliary electrode 71 and the second auxiliary electrode 72 is reinforced, thereby increasing the charge transport efficiency in the organic semiconductor layer 40.

Voltages having different polarities may be applied to the first gate electrode 61 and the second gate electrode 62. For example, a negative-polarity voltage may be applied to the first gate electrode 61, and a positive-polarity voltage may be applied to the second gate electrode 62. If the negative-polarity voltage is applied to the first gate electrode 61, the number of holes injected from the source electrode 20 adjacent to the first gate electrode 61 into the organic semiconductor layer 40 may increase. If the positive-polarity voltage is applied to the second gate electrode 62, the number of holes injected from the drain electrode 30 adjacent to the second gate electrode 62 into the organic semiconductor layer 40 may increase. Therefore, if the negative-polarity voltage is applied to the first gate electrode 61 and the positive-polarity voltage is applied to the second gate electrode 62, the amount of charge injected into the organic semiconductor layer 40 may increase. Conversely, if the positive-polarity voltage is applied to the first gate electrode 61 and the negative-polarity voltage is applied to the second gate electrode 62, the amount of charge injected into the organic semiconductor layer 40 may decrease.

Since the other components of the organic light emitting transistor T5 are substantially the same as those shown in FIG. 2, repeated descriptions thereof will be omitted.

According to some embodiments, the first auxiliary electrode 71 or the second auxiliary electrode 72 may not be provided.

Figure 8:
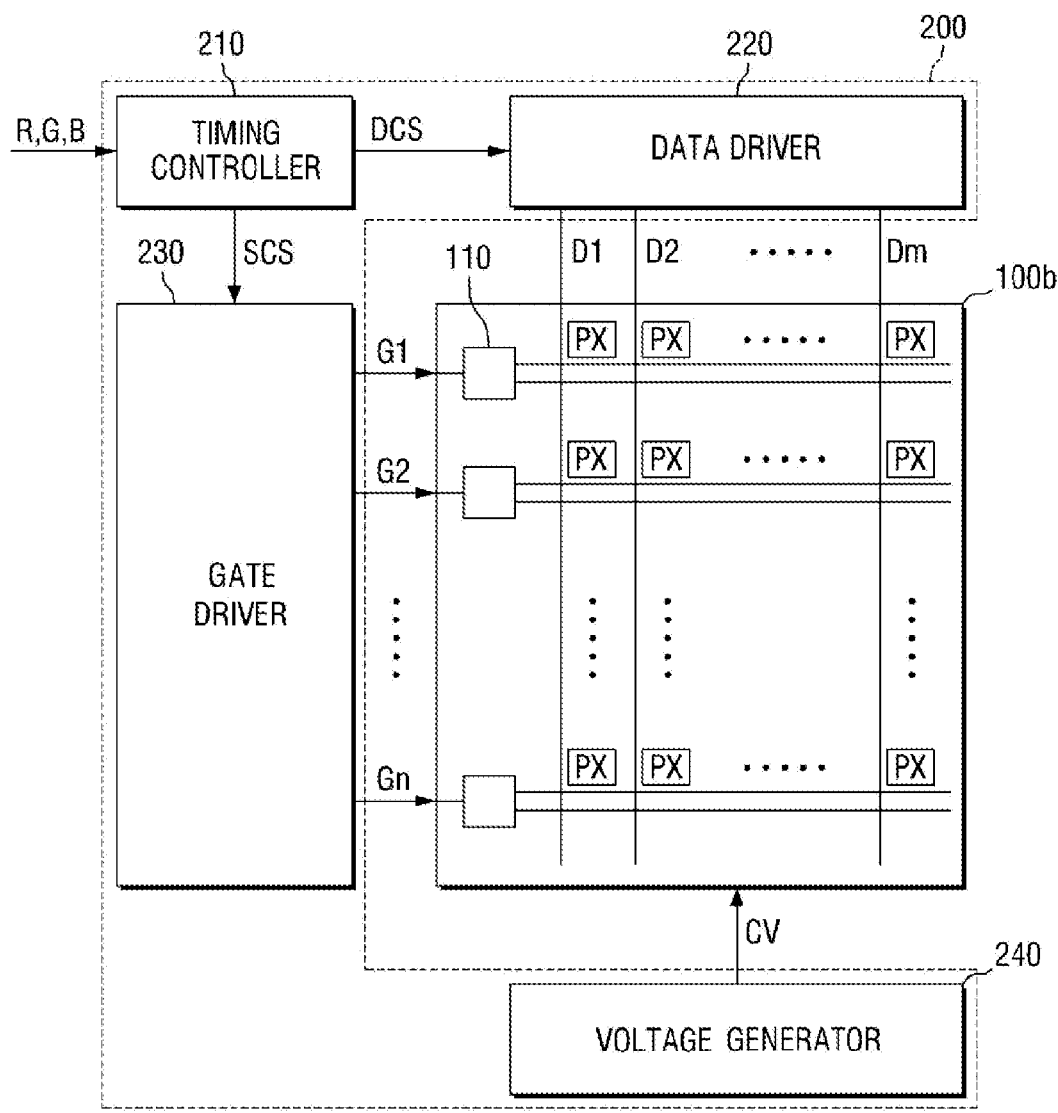
FIG. 8 is a block diagram of a display device according to still another embodiment of the present invention.

Hereinafter, still another embodiment of the present invention will be described in more detail with reference to FIG. 8. FIG. 8 is a block diagram of a display device according to still another embodiment of the present invention.

Referring to FIG. 8, the display device 1000b may include a display panel 100b and a driver 200.

The display panel 100b may include a voltage converter 110. The voltage converter 110 may generate second gate signals G1', G2', . . . , and Gn' from first gate signals G1, G2, . . . , and Gn. For example, the voltage converter 110 may generate the second gate signals G1', G2', . . . , and Gn' by inverting polarities of the first gate signals G1, G2, . . . , and Gn or lowering voltage levels of the first gate signals G1, G2, . . . , and Gn.

Figure 9:
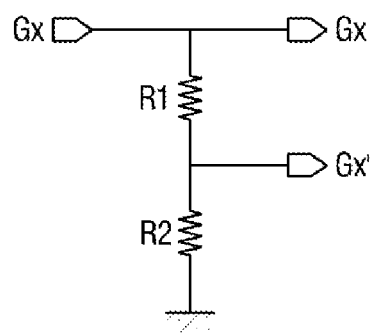
FIG. 9 is a circuit diagram of a voltage converter according to still another embodiment of the present invention.

Hereinafter, an embodiment of the voltage converter 110 will be described with reference to FIG. 9. FIG. 9 is a circuit diagram of a voltage converter according to still another embodiment of the present invention.

The voltage converter 110 may include a first resistor R1 and a second resistor R2 connected in series with each other. The voltage converter 110 may generate the second gate signal Gx' by lowering the voltage level of the first gate signal Gx by dividing the voltages of the first resistor R1 and the second resistor R2 connected in series with each other, where x is an arbitrary natural number between 1 and n.

Referring again to FIG. 8, an organic light emitting transistor of each of a plurality of pixels PX included in the display panel 100b may be substantially the same as the organic light emitting transistor T5 shown in FIG. 7.

Since the other components of the display device 1000b are substantially the same as those shown in FIG. 1, repeated descriptions thereof will be omitted.

While the present invention has been particularly shown and described with reference to exemplary embodiments thereof, it will be understood by those of ordinary skill in the art that various changes in form and detail may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. An organic light emitting transistor, comprising:
a substrate;
an organic semiconductor layer positioned on the substrate;
a source electrode and a drain electrode spaced apart from each other while contacting the organic semiconductor layer;
a gate electrode insulated from the organic semiconductor layer, the source electrode and the drain electrode, and positioned to overlap the organic semiconductor layer; and
a first auxiliary electrode overlapping the source electrode and a second auxiliary electrode overlapping the drain electrode,
the gate electrode not overlapping the source electrode and the drain electrode,
wherein the first auxiliary electrode, the second auxiliary electrode and the gate electrode are disposed directly on a same layer.

2. The organic light emitting transistor of claim 1, the first auxiliary electrode overlapping the source electrode configured to accept an application of a negative-polarity voltage.

3. The organic light emitting transistor of claim 1, the second auxiliary electrode overlapping the drain electrode configured to accept an application of a positive-polarity voltage.

4. The organic light emitting transistor of claim 1, the second auxiliary electrode configured to accept an application of a voltage, the first auxiliary electrode configured to accept an application of a voltage having a same polarity as the voltage applied to the second auxiliary electrode.

5. The organic light emitting transistor of claim 1, the first auxiliary electrode configured to accept an application of a negative-polarity voltage, and the second auxiliary electrode configured to accept an application of a positive-polarity voltage.

6. An organic light emitting transistor, comprising:
a substrate;
an organic semiconductor layer positioned on the substrate;
a source electrode and a drain electrode spaced apart from each other while contacting the organic semiconductor layer;
a gate electrode insulated from the organic semiconductor layer, the source electrode and the drain electrode, and positioned to overlap the organic semiconductor layer; and
an auxiliary electrode overlapping one of the source electrode and the drain electrode,
the gate electrode not overlapping the source electrode and the drain electrode,
wherein the gate electrode comprises:
a first gate electrode adjacent to the source electrode; and
a second gate electrode adjacent to the drain electrode.

7. The organic light emitting transistor of claim 6, the second gate electrode configured to accept an application of a voltage, the first gate electrode configured to accept an application of a voltage higher than the voltage applied to the second gate electrode.

8. The organic light emitting transistor of claim 6, the second gate electrode configured to accept an application of a voltage, the first gate electrode configured to accept an application of a voltage with a different polarity from the voltage applied to the second gate electrode.

9. A display device, comprising:
a display panel including a plurality of organic light emitting transistors; and
a driver for driving the organic light emitting transistors;
each of the organic light emitting transistors comprising:
a substrate;
an organic semiconductor layer positioned on the substrate;
a source electrode and a drain electrode spaced apart from each other while contacting the organic semiconductor layer;
a gate electrode insulated from the organic semiconductor layer, the source electrode and the drain electrode and positioned to overlap the organic semiconductor layer; and
a first auxiliary electrode overlapping the source electrode and a second auxiliary electrode overlapping the drain electrode, the gate electrode not overlapping the source electrode and the drain electrode, wherein the first auxiliary electrode, the second auxiliary electrode and the gate electrode are disposed directly on a same layer.

10. The display device of claim 9, the first auxiliary electrode configured to accept an application of a negative-polarity voltage.

11. The display device of claim 9, the second auxiliary electrode configured to accept an application of a positive-polarity voltage.

12. The display device of claim 9, the second auxiliary electrode configured to accept an application of a voltage, the first auxiliary electrode configured to accept an application of a voltage having a same polarity as the voltage applied to of the second auxiliary electrode.

13. The display device of claim 9, the first auxiliary electrode configured to accept an application of a negative-polarity voltage, and the second auxiliary electrode configured to accept an application of a positive-polarity voltage.

14. The display device of claim 9, the driver including a voltage generator that supplies a control voltage applied to the auxiliary electrode.

15. A display device, comprising:
a display panel including a plurality of organic light emitting transistors; and
a driver for driving the organic light emitting transistors;
each of the organic light emitting transistors comprising:
a substrate;
an organic semiconductor layer positioned on the substrate;
a source electrode and a drain electrode spaced apart from each other while contacting the organic semiconductor layer;
a gate electrode insulated from the organic semiconductor layer, the source electrode and the drain electrode and positioned to overlap the organic semiconductor layer; and
an auxiliary electrode overlapping one of the source electrode and the drain electrode,
the gate electrode not overlapping the source electrode and the drain electrode, wherein the gate electrode comprises:
a first gate electrode adjacent to the source electrode; and
a second gate electrode adjacent to the drain electrode.

16. The display device of claim 15, the second gate electrode configured to accept an application of a voltage, the first gate electrode configured to accept an application of a voltage higher than voltage applied to the second gate electrode.

17. The display device of claim 15,
the second gate electrode configured to accept an application of a voltage, the first gate electrode configured to accept an application of a voltage having a different polarity compared to the voltage applied to the second gate electrode.

18. The display device of claim 15, the driver configured to generate a first gate voltage and a second gate voltage, and connect to the first gate electrode and the second gate electrode to apply the first gate voltage to the first gate electrode and the second gate voltage to the second gate electrode.

19. An organic light emitting transistor, comprising:
a substrate;
an organic semiconductor layer positioned on the substrate;
a source electrode and a drain electrode spaced apart from each other while contacting the organic semiconductor layer;
a gate electrode insulated from the organic semiconductor layer, the source electrode and the drain electrode, and positioned to overlap the organic semiconductor layer; and
a first auxiliary electrode overlapping the source electrode and a second auxiliary electrode overlapping the drain electrode,
the gate electrode not overlapping the source electrode and the drain electrode,
wherein the first auxiliary electrode and the second auxiliary electrode are insulated from the source electrode and the drain electrode, and
wherein the first auxiliary electrode, the second auxiliary electrode and the gate electrode are disposed directly on a same layer.

* * * * *